United States Patent
Sasaki

(10) Patent No.: US 8,890,561 B2
(45) Date of Patent: Nov. 18, 2014

(54) TCP-TYPE SEMICONDUCTOR DEVICE AND METHOD OF TESTING THEREOF

(75) Inventor: Suguru Sasaki, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 261 days.

(21) Appl. No.: 13/365,508

(22) Filed: Feb. 3, 2012

(65) Prior Publication Data

US 2012/0133035 A1    May 31, 2012

Related U.S. Application Data

(63) Continuation of application No. 12/588,460, filed on Oct. 15, 2009, now Pat. No. 8,138,777.

(30) Foreign Application Priority Data

Oct. 21, 2008 (JP) .................................. 2008-270989
Feb. 17, 2009 (JP) .................................. 2009-033620

(51) Int. Cl.
*G01R 31/26* (2014.01)
*H01L 23/495* (2006.01)
*G01R 31/28* (2006.01)
*H01L 23/00* (2006.01)

(52) U.S. Cl.
CPC ... *G01R 31/2884* (2013.01); *H01L 2924/01006* (2013.01); *H01L 2924/01038* (2013.01); *H01L 2924/014* (2013.01); *H01L 2924/01075* (2013.01); *H01L 2924/01033* (2013.01); *H01L 2924/01082* (2013.01); *H01L 24/50* (2013.01); *H01L 2924/01005* (2013.01)
USPC ...................................... 324/762.01; 257/668

(58) Field of Classification Search
CPC ... H01L 24/06; H01L 23/49541; H01L 23/50; H01L 23/528; H03K 19/00353
See application file for complete search history.

(56) References Cited

U.S. PATENT DOCUMENTS

| | | | |
|---|---|---|---|
| 5,477,138 A | 12/1995 | Erjavic et al. | |
| 5,585,666 A * | 12/1996 | Imamura | 257/668 |
| 5,606,263 A | 2/1997 | Yoshizawa et al. | |
| 5,844,418 A * | 12/1998 | Wood et al. | 324/756.02 |
| 6,899,544 B2 * | 5/2005 | Tanokura et al. | 439/60 |
| 2002/0063317 A1 | 5/2002 | Hashimoto | |

FOREIGN PATENT DOCUMENTS

| CN | 1574262 (A) | 2/2005 |
|---|---|---|
| JP | 4-5643 | 1/1992 |
| JP | 8-78471 (A) | 3/1996 |
| JP | 8-94668 (A) | 4/1996 |

(Continued)

OTHER PUBLICATIONS

Taiwanese Office Action dated Oct. 26, 2012 with a partial English translation thereof.

(Continued)

*Primary Examiner* — Tung X Nguyen
(74) *Attorney, Agent, or Firm* — McGinn IP Law Group, PLLC

(57) ABSTRACT

A semiconductor device includes a base film, a semiconductor chip mounted on the base film, and a plurality of leads formed on the base film, each of the leads including one end coupled to the semiconductor chip and another end being opposite to the one end. The another end of a first one of the leads and the another end of a second one of the leads are located at different positions respectively between the semiconductor chip and a cut line along which the base film is cut.

19 Claims, 12 Drawing Sheets

(56) References Cited

FOREIGN PATENT DOCUMENTS

| JP | 8-222299 (A) | 8/1996 |
| JP | 11-66136 (A) | 3/1999 |
| JP | 11-191577 (A) | 7/1999 |
| JP | 2004-356339 (A) | 12/2004 |

OTHER PUBLICATIONS

Chinese Office Action dated Jul. 4, 2012, with English translation.
Japanese Office Action dated Nov. 1, 2012 with a partial English translation thereof.

* cited by examiner

TCP-TYPE SEMICONDUCTOR DEVICE AND METHOD OF TESTING THEREOF

The present application is a Continuation Application of U.S. patent application Ser. No. 12/588,460 filed on Oct. 15, 2009, now U.S. Pat. No. 8,138,777 which is based on and claims priority from Japanese patent application No. 2008-270989 filed on Oct. 21, 2008 and Japanese patent application No. 2009-033620 filed on Feb. 17, 2009, the entire contents of which are incorporated herein by reference.

BACKGROUND OF THE INVENTION

1. Field of the Invention

The present invention relates to a semiconductor device and a method of testing thereof. In particular, the present invention relates to a TCP (Tape Carrier Package)-type semiconductor device and a method of testing thereof.

2. Description of Related Art

A probe card used for testing a semiconductor device is publicly known. The probe card has a large number of probes that come in contact with test terminals of a test target. The test is performed by bringing respective ends of the probes into the corresponding test terminals, supplying a test signal from a tester to the test target through the probe card and retrieving an output signal from the test target. At this time, it is required to correctly bring each probe into one-on-one contact with the corresponding test terminal so as not to cause a short failure and the like.

On the other hand, a pitch between adjacent test terminals is getting narrower due to recent miniaturization and increase in the number of terminals of the semiconductor device. Therefore, the probe card also needs to follow the narrowing of the test terminal pitch. For example, it may be considered to narrow a pitch between ends of adjacent probes of the probe card following the narrowing of the test terminal pitch. However, there is a limit to the narrowing of the pitch between the probe ends because electrical isolation must be ensured between the adjacent probes. Consequently, it is proposed to distribute positions of the probe ends over a plurality of rows. Due to this configuration, it is possible to narrow a substantive pitch between the probe ends while ensuring the electrical isolation between the probes, which enables following the narrowing of the test terminal pitch. Probe cards having such the probe pattern are disclosed, for example, in Japanese Laid-Open Patent Application JP-H08-94668, Japanese Laid-Open Patent Application JP-H08-222299 and Japanese Laid-Open Utility Model Application JU-A-Heisei 04-5643.

Moreover, a TCP (Tape Carrier Package)-type semiconductor device is publicly known. In the case of the TCP, a semiconductor chip is mounted on a base film such as a TAB (Tape Automated Bonding) tape. The TCP-type semiconductor device also includes the so-called COF (Chip On Film).

FIG. 1 is a plan view schematically showing the TCP-type semiconductor device disclosed in Japanese Laid-Open Patent Application JP-2004-356339. In FIG. 1, a semiconductor chip 120 is mounted on a base film (tape carrier) 110. Moreover, a plurality of leads 130 and a plurality of contact pads 140 are formed on the base film 110. The plurality of leads 130 electrically connect between the semiconductor chip 120 and the plurality of contact pads 140, respectively.

More specifically, as shown in FIG. 1, solder resist SR is so formed as to partially cover each lead 130. The solder resist SR is resin applied on the lead 130 and plays roles of not only electrically isolating the leads 130 but also relaxing chemical stress such as corrosion and physical stress on the leads 130 due to external force. The lead 130 in a region where the solder resist SR is not formed serves as a terminal that is electrically connectable to the outside, and the region is a terminal region. The semiconductor chip 120 is mounted on a central terminal region in which the solder resist SR is not formed, and then it is resin-sealed. On the other hand, an outside terminal region in which the solder resist SR is not formed is an external terminal region and is electrically connected to the contact pads 140.

The contact pads 140 are test terminals used at the time of testing the semiconductor chip 120 and are placed within a predetermined region (pad placement region RP) on the base film 110. That is, at the time of testing the semiconductor chip 120, the probes of the probe card come in contact with the contact pads 140 within the pad placement region RP. Then, a test signal is supplied to the semiconductor chip 120 and an output signal is retrieved from the semiconductor chip 120 through the contact pads 140 and the leads 130. It should be noted that the probe card used here also has the probe pattern where positions of the probe ends are distributed over a plurality of rows. Corresponding to the probe pattern, the contact pads 140 also are distributed over a plurality of rows as shown in FIG. 1.

In FIG. 1, a width direction and an extending direction of the base film 110 are x-direction and y-direction, respectively. The structure shown in FIG. 1 is formed repeatedly along the y-direction. On separating the semiconductor device one by one after the test, the base film 110 and the plurality of leads 130 are cut along a cut line CL indicated by a dashed line in FIG. 1. At this time, the contact pads 140 in the pad placement region RP remain on the base film 110.

The inventor of the present application has recognized the following point. In recent years, the number of terminals of the semiconductor chip is increasing, and thus the numbers of test signals supplied to the semiconductor chip and output signals retrieved from the semiconductor chip at the time of the test also are increasing. This means increase in the number of contact pads 140 of the TCP-type semiconductor device shown in FIG. 1. The increase in the number of contact pads 140 leads to enlargement of the pad placement region RP and thus to increase in the width and length of the base film 110. As a result, costs of manufacturing the TCP-type semiconductor device are increased. Therefore, a technique that can reduce the costs of manufacturing the TCP-type semiconductor device is desired.

SUMMARY

In one embodiment of the present invention, a TCP-type semiconductor device and a method of testing thereof are provided. The TCP-type semiconductor device has: a base film; a semiconductor chip mounted on the base film; and a plurality of leads formed on the base film. Each of the plurality of leads has: first terminal portion including a first end that is one end of the each lead and connected to the semiconductor chip; and a second terminal portion including a second end that is the other end of the each lead and located on the opposite side of the first terminal portion. At the time of testing the TCP-type semiconductor device, not a special contact pad but the second terminal portion of each lead is used for contact with a probe. Therefore, the contact pads dedicated to test as shown in FIG. 1 are not provided, and the pad placement region is excluded from on the base film. It is thus possible to reduce costs of manufacturing the TCP-type semiconductor device.

In the case where the second terminal portion of each lead instead of the special contact pad is used for the contact with the probe at the time of testing, it is feared that a needlepoint of one probe simultaneously comes in contact with two adjacent leads and thereby a short failure between the adjacent leads is caused. According to the present invention, a TCP-type semiconductor device that can solve this problem and a method of testing thereof are also provided.

In another embodiment of the present invention, a TCP-type semiconductor device is provided. The TCP-type semiconductor device has: a base film; a semiconductor chip mounted on the base film; and a plurality of leads formed on the base film. Each of the plurality of leads has: a first terminal portion including a first end that is one end of the each lead and connected to the semiconductor chip; and a second terminal portion including a second end that is the other end of the each lead and located on the opposite side of the first terminal portion. In a terminal region including the second terminal portion of the each lead, the plurality of leads are parallel to each other along a first direction. The plurality of leads include a first lead and a second lead that are adjacent to each other. The first lead and the second lead are different in a position of the second end in the first direction.

In still another embodiment of the present invention, a TCP-type semiconductor device is provided. The TCP-type semiconductor device has: a base film; a semiconductor chip mounted on the base film; and a plurality of lead groups formed on the base film. Each of the plurality of lead groups has a predetermined number of leads. Each of the predetermined number of leads has: a first terminal portion including a first end that is one end of the each lead and connected to the semiconductor chip; and a second terminal portion including a second end that is the other end of the each lead and located on the opposite side of the first terminal portion. In a terminal region including the second terminal portion of the each lead, the predetermined number of leads are parallel to each other along a first direction. The predetermined number of leads are different in a position of the second end in the first direction.

In still another embodiment of the present invention, a method of testing a TCP-type semiconductor device by using a probe card is provided. The TCP-type semiconductor device has: a base film; a semiconductor chip mounted on the base film; and a plurality of lead groups formed on the base film. Each of the plurality of lead groups has a predetermined number of leads. Each of the predetermined number of leads has: a first terminal portion including a first end that is one end of the each lead and connected to the semiconductor chip; and a second terminal portion including a second end that is the other end of the each lead and located on the opposite side of the first terminal portion. In a terminal region including the second terminal portion of the each lead, the predetermined number of leads are parallel to each other along a first direction. The predetermined number of leads are different in a position of the second end in the first direction. On the other hand, the probe card has a plurality of probe groups that respectively come in contact with the plurality of lead groups. Each of the plurality of probe groups has a predetermined number of probes that respectively come in contact with the predetermined number of leads. Respective ends of the predetermined number of probes are different in a position in the first direction. The testing method according to the present invention includes: (A) bringing the predetermined number of probes of the plurality of probe groups into contact with the predetermined number of leads of the plurality of lead groups, respectively; and (B) supplying a test signal to the semiconductor chip or retrieving an output signal from the semiconductor chip through the probe card and the plurality of lead groups.

According to the present invention, the costs of manufacturing the TCP-type semiconductor device can be reduced. Moreover, an inter-terminal short in which one probe is simultaneously in contact with two terminals can be prevented from occurring at the time of testing the TCP-type semiconductor device.

BRIEF DESCRIPTION OF THE DRAWINGS

The above and other objects, advantages and features of the present invention will be more apparent from the following description of certain preferred embodiments taken in conjunction with the accompanying drawings, in which.

DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

A semiconductor device and a method of testing thereof according to an embodiment of the present invention will be described below with reference to the attached drawings.

1. Overall Configuration

Figure 1:
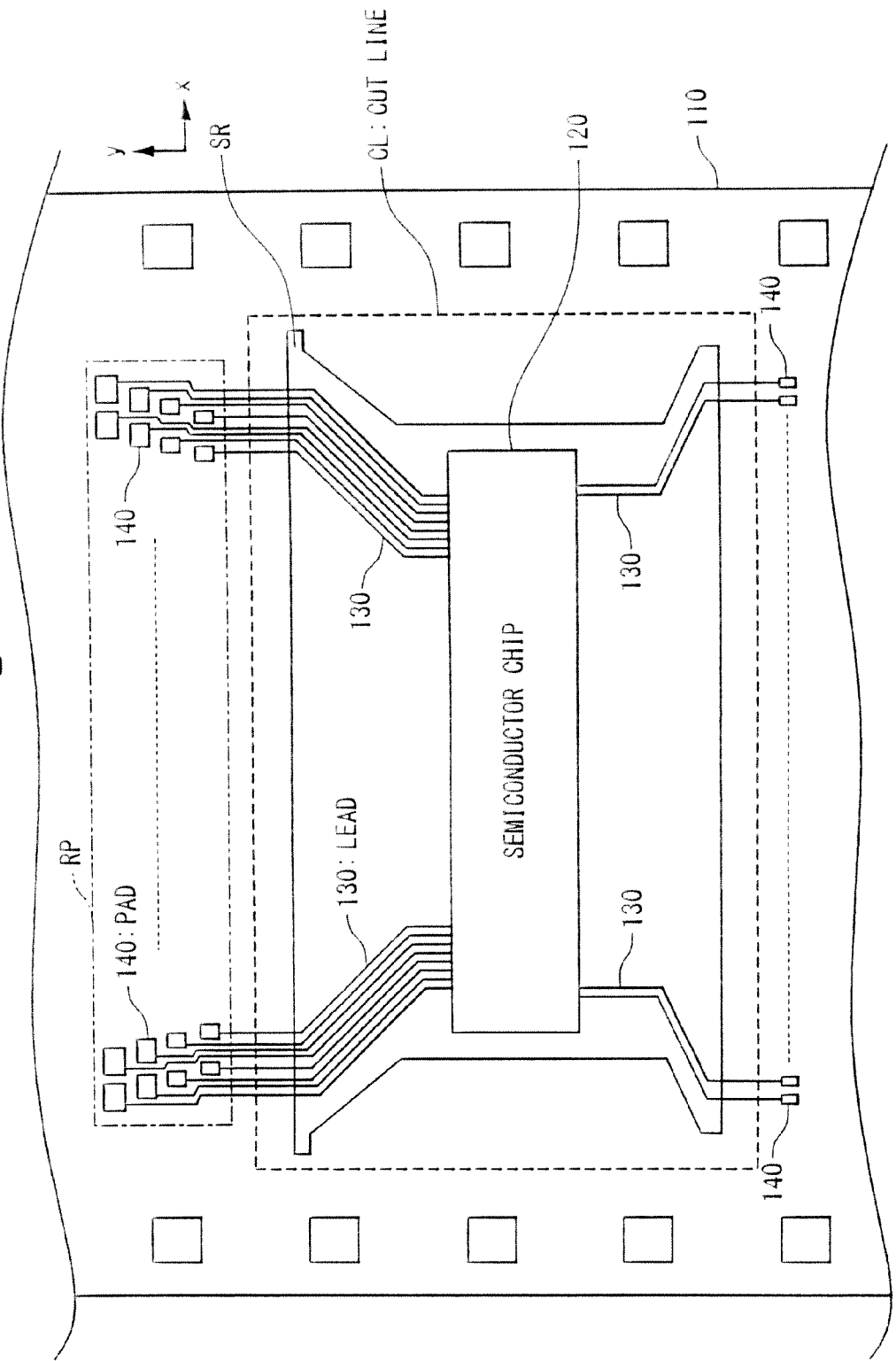
FIG. 1 is a plan view schematically showing a typical TCP-type semiconductor device.
Figure 2:
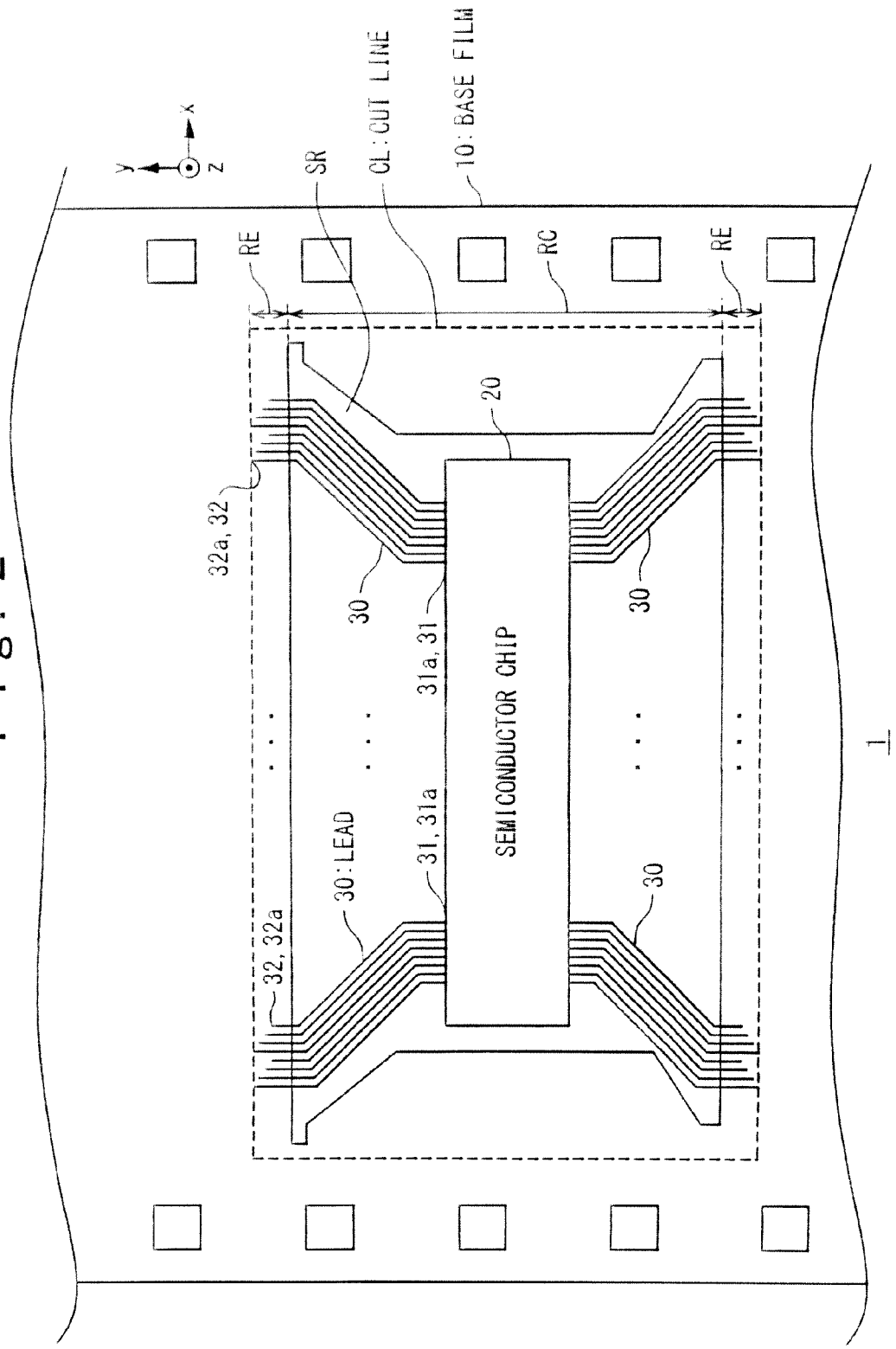
FIG. 2 is a plan view schematically showing a configuration of a semiconductor device according to an embodiment of the present invention.

FIG. 2 is a plan view schematically showing a configuration of a semiconductor device 1 according to the present embodiment. The semiconductor device 1 according to the present embodiment is a TCP-type semiconductor device. The semiconductor device 1 has a base film (tape carrier) 10 such as a TAB tape, a semiconductor chip 20 mounted on the base film 10, and a plurality of leads 30 formed on the base film 10. Each lead 30 has a first terminal portion 31 including its one end (first end 31a) and a second terminal portion 32 including the other end (second end 32). The first terminal portion 31 among them is connected to the semiconductor chip 20. On the other hand, the second terminal portion 32 is located on the opposite side of the first terminal portion 31. According to the present embodiment, as will be described in detail later, the second terminal portion 32 (second end 32a) of each lead 30 is not connected to a test-dedicated contact pad, which is different from the case of FIG. 1.

More specifically, as shown in FIG. 2, solder resist SR is so formed as to partially cover each lead 30. The solder resist SR is resin applied on the lead 30 and plays roles of not only electrically isolating the leads 30 but also relaxing chemical stress such as corrosion and physical stress on the leads 30 due to external force. The lead 30 in a region where the solder resist SR is not formed serves as a terminal that is electrically connectable to the outside, and the region is a terminal region. The semiconductor chip 20 is mounted on a central terminal region in which the solder resist SR is not formed, and then it is resin-sealed. A region covered by the solder resist SR and sealing resin is hereinafter referred to as a "cover region RC".

On the other hand, an outside terminal region in which the solder resist SR is not formed is hereinafter referred to as an "external terminal region RE". The external terminal region RE corresponds to a region where the lead 30 projects outward from the cover region RC. A portion of the lead 30 projecting outward from the cover region RC serves as an external terminal. As shown in FIG. 2, the external terminal region RE includes the second terminal portion 32 of each lead 30. It should be noted that among two opposed sides of the external terminal region RE, a side on the side of the semiconductor chip 20 corresponds to one side of a region in which the solder resist SR is formed, and the opposite side corresponds to one side of a cut line CL described later.

The lead 30 (external terminal) within the external terminal region RE is used for connection with another device. For example, in a case where the semiconductor chip 20 is an IC for driving a liquid crystal display panel, the leads 30 within the external terminal region RE are connected to electrodes of the liquid crystal display panel. As a result, the liquid crystal display panel and the semiconductor chip 20 for driving it are electrically connected with each other. It should be noted that this connection process is generally called OLE (Outer Lead Bonding).

According to the present embodiment, at the time of testing the semiconductor device 1, a special contact pad is not used for contact with a probe card. Instead, the second terminal portion 32 within the external terminal region RE is used for contact with the probe card. That is to say, the lead 30 in the external terminal region RE is used not only for the connection with another device but also for the contact with the probe card at the test. Therefore, in the present embodiment, the contact pads 140 dedicated to test as shown in FIG. 1 are not provided, and the pad placement region RP is excluded from on the base film 10. As shown in FIG. 2, the second terminal portion 32 (second end 32a) of each lead 30 is not connected to a test-dedicated contact pad.

According to the present embodiment, as described above, the pad placement region RP is excluded and thus an area of the base film 10 can be saved. In other words, a region on the base film 10 required for one semiconductor chip 20 can be greatly reduced as compared with the case of FIG. 1. It is therefore possible to reduce material cost and also to improve efficiency of placing the semiconductor chips 20 on the base film 10. It is thus possible to reduce the costs of manufacturing the semiconductor device 1.

In FIG. 2, a width direction and an extending direction of the base film 10 are x-direction and y-direction, respectively. The structure shown in FIG. 2 is formed repeatedly along the y-direction. A region surrounded by the cut line CL indicated by a dashed line corresponds to one semiconductor device. On separating the semiconductor device one by one after the test, the base film 10 is cut along the cut line CL. It should be noted that the leads 30 are not cut at this time. The reason is that no test-dedicated contact pad is formed on the base film 10 and the lead 30 is not connected to any contact pad.

2. External Terminal Region

According to the present embodiment, as described above, the second terminal portion 32 within the external terminal region RE instead of a contact pad is used for the contact with the probe card. At this time, it is required to correctly bring each probe of the probe card into one-on-one contact with the corresponding lead 30 so as not to cause a short failure and the like. However, a space (gap) between adjacent leads 30 on the base film 10 is narrow. Thus, when the base film 10 expands and contracts due to moisture absorption, temperature variation and the like, it is feared that a needlepoint of a probe simultaneously comes in contact with two adjacent leads 30 and thereby a short failure between the adjacent leads 30 is caused. According to the present embodiment, the leads 30 in the external terminal region RE have the following features in order to prevent such the short failure between the leads 30.

Figure 3:
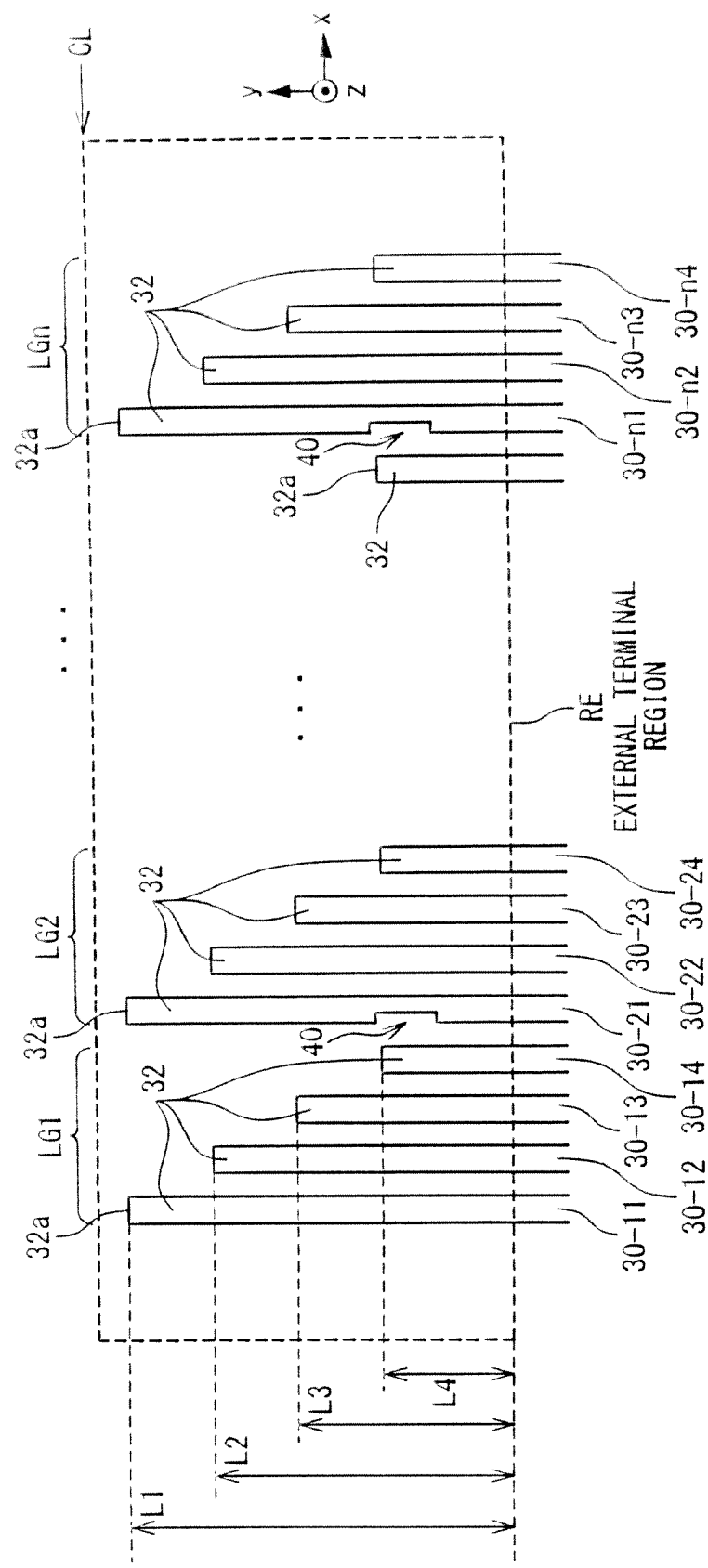
FIG. 3 is a plan view showing an example of a lead configuration in an external terminal region of the semiconductor device according to the present embodiment.

FIG. 3 shows one example of a configuration of the leads 30 in the external terminal region RE. As shown in FIG. 3, the plurality of leads 30 extend to within the external terminal region RE, and the second terminal portions 32 of the respective leads 30 are included in the external terminal region RE. In the external terminal region RE, the plurality of leads 30 are parallel to each other along a predetermined direction (first direction). In the present example, the first direction is the y-direction. A width direction of each lead 30 is the x-direction perpendicular to the y-direction. The plurality of leads 30 are so arranged as to be adjacent to one another in the x-direction. Typically, a width of each lead 30 is uniform, and a pitch between adjacent leads 30 is uniform.

According to the present embodiment, as shown in FIG. 3, respective positions of the second ends 32a of two adjacent leads 30 are different in the y-direction (first direction). For example, a lead 30-11 and a lead 30-12 are adjacent to each other, and the lead 30-11 and the lead 30-12 are different in the position of the second end 32a in the y-direction. As a result, a wide space where no other lead 30 exists is ensured next to the second terminal portion 32 of the lead 30-11. The same applies to a relationship between leads 30-12 and 30-13 and a relationship between leads 30-13 and 30-14.

From a viewpoint of a length of the lead 30, the followings can be said. Here, let us consider a length in the y-direction within the external terminal region RE. In this case, the length is different between two adjacent leads 30. For example, the length L1 of the lead 30-11 is larger than the length L2 of the lead 30-12. The length L2 of the lead 30-12 is larger than the length L3 of the lead 30-13. The length L3 of the lead 30-13 is larger than the length L4 of the lead 30-14. That is, there is a relationship "L1>L2>L3>L4" between the lengths of the leads 30-11 to 30-14. As a result, a wide space where no other lead 30 exists is ensured next to the second terminal portion 32 of each of the leads 30-11 to 30-13.

From a viewpoint of a distance between the second end 32a of the lead 30 and the cut line CL of the base film 10, the followings can be said. That is, as shown in FIG. 2 and FIG. 3, the distance between the second end 32a and the cut line CL is different between two adjacent leads 30. For example, the distance between the second end 32a of the lead 30-11 and the cut line CL is smaller than the distance between the second end 32a of the lead 30-12 and the cut line CL.

Moreover, a lead 30-13 and a lead 30-21 are formed on both sides of a lead 30-14. The length of each the lead 30-13 and the lead 30-21 is larger than the length of the lead 30-14. That is to say, the second end 32a (second terminal portion 32) of the lead 30-14 is located (sandwiched) between the leads 30-13 and 30-21. It is therefore preferable that a notch portion (concave portion) 40 facing with at least a part of the second terminal portion 32 of the lead 30-14 is formed on at least one of the leads 30-13 and 30-21. In the example shown in FIG. 3, the lead 30-21 has the notch portion 40 that faces with at least a part of the second terminal portion 32 of the lead 30-14. As a result, a sufficient space is ensured next to the second terminal portion 32 of the lead 30-14 as well. It should be noted that the length of the notch portion 40 is larger than a diameter of a needlepoint of the probe.

In the external terminal region RE, a similar lead pattern may be formed repeatedly. In this case, the plurality of leads 30 are classified into a plurality of lead groups LG. The plurality of lead groups LG are arranged in the x-direction. Each lead group LG includes a predetermined number of leads 30 and has a similar lead pattern. In the example shown in FIG. 3, n lead groups LG1 to LGn are arranged in the x-direction, and the lead group LGi (i=1 to n) includes four leads 30-i1 to 30-i4. In each lead group LGi, the leads 30-i1 to 30-i4 are different in the position of the second end 32a in the y-direction. Consequently, the space is ensured.

From a viewpoint of the length in the y-direction within the external terminal region RE, the lengths of the leads 30-i1 to 30-i4 are L1, L2, L3 and L4, respectively. The lengths L1 to L4 are different from each other. In the example shown in FIG. 3, there is the relationship "L1>L2>L3>L4" between the lengths L1 to L4. Therefore, in each lead group LGi, the lead 30-i1 is the longest lead and the lead 30-i4 are the shortest lead. In each lead group LGi, the leads 30-i1 to 30-i4 are arranged such that the length becomes monotonically smaller from the longest lead to the shortest lead. In other words, each lead group LGi has a sawtooth-shape lead pattern.

In the example shown in FIG. 3, the same lead pattern appears repeatedly in the x-direction. That is to say, an arrangement direction from the longest lead 30-i1 toward the shortest lead 30-i4 is the same +x-direction between the lead groups LG1 to LGn. As a result, the space is ensured on the same +x-direction side of the second terminal portion 32 for each lead 30 except for the shortest lead 30-i4.

Moreover, in FIG. 3, the shortest lead included in a certain lead group LG is adjacent to the longest lead included in the adjacent lead group LG. For example, the shortest lead 30-14 included in the lead group LG1 and the longest lead 30-21 included in the adjacent lead group LG2 are adjacent to each other. In this case, it is preferable that the longest lead 30-21 has the notch portion 40 facing with at least a part of the second terminal portion 32 of the shortest lead 30-14. As a result, the space is ensured on the same +x-direction side of the second terminal portion 32 for all the leads 30.

3. Testing Method

Figure 4:
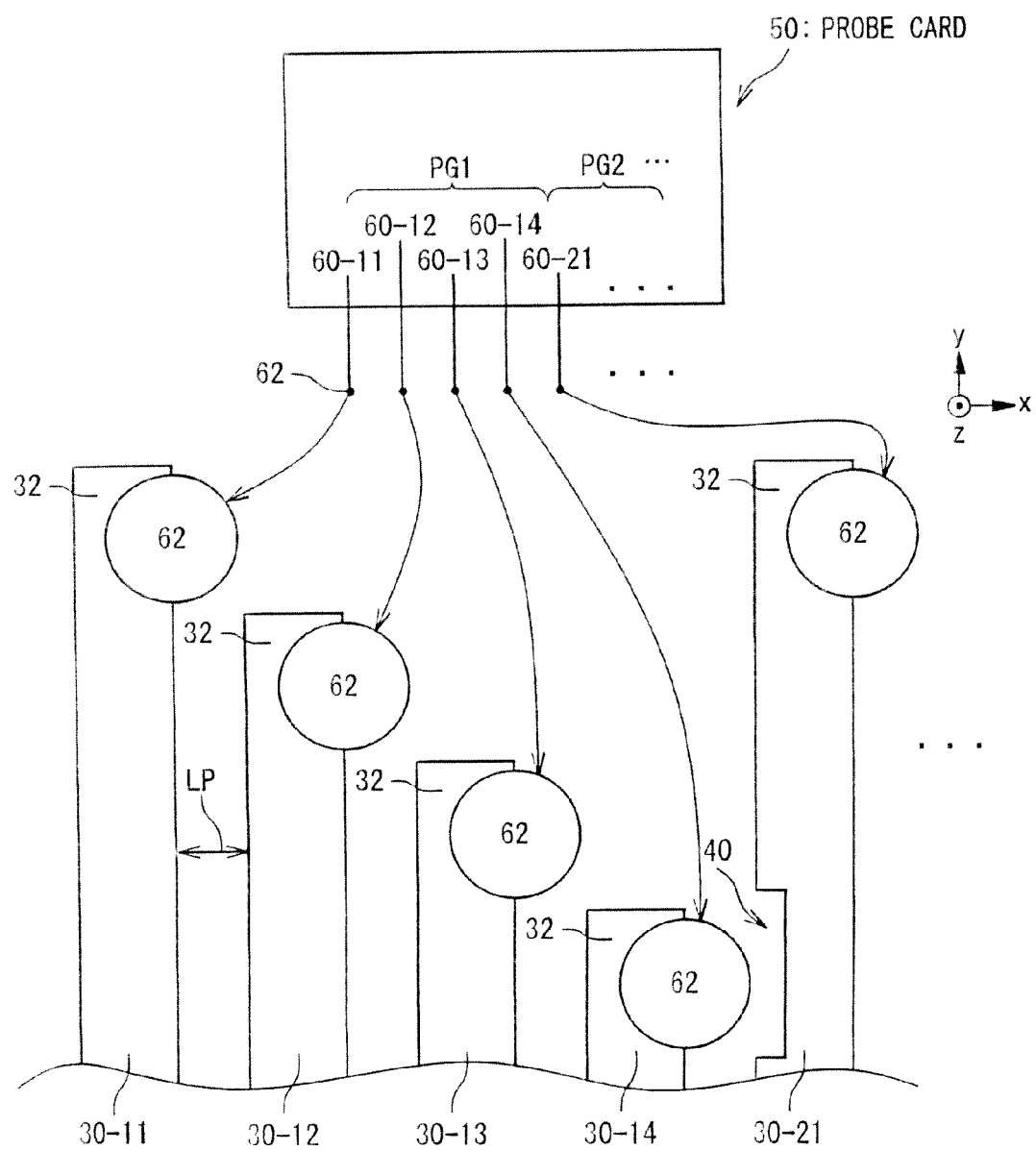
FIG. 4 is a schematic diagram showing a method of testing the semiconductor device according to the present embodiment.

FIG. 4 is a schematic diagram showing a method of testing the semiconductor device 1 according to the present embodiment. In the test of the semiconductor device 1, a probe card 50 is used. The probe card 50 has a plurality of probes 60 that respectively come in contact with the above-mentioned plurality of leads 30. The probe card 50 has a probe pattern where end positions of the probes 60 are distributed over a plurality of rows.

More specifically, the probe card 50 has a plurality of probe groups PG1 to PGn that respectively come in contact with the above-mentioned plurality of lead groups LG1 to LGn. Each probe group PGi (i=1 to n) include probes 60-i1 to 60-i4 that respectively come in contact with the leads 30-i1 to 30-i4. For example, the probe group PG1 includes four probes 60-11 to 60-14 that respectively come in contact with the four leads 30-11 to 30-14. At the time of the test, the respective probes 60 are brought into contact with the corresponding leads 30 within the external terminal region RE. At this time, as shown in FIG. 4, a tip portion 62 (hereinafter referred to as a "probe end 62") of each probe 60 is in contact with the second terminal portion 32 (near the second end 32a) of the corresponding lead 30. That is to say, a positional relationship among the probe ends 62 of the plurality of probes 60 is almost the same as a positional relationship among the second ends 32a of the plurality of leads 30. Respective probe ends 62 of the probes 60-i1 to 60-i4 of the probe group PGi are different in a position in the y-direction.

At the time of the test, it is required to correctly bring each probe 60 into one-on-one contact with the corresponding lead 30. However, if a lead pitch LP is very small, the probe end 62 of one probe 60 may simultaneously come in contact with two adjacent leads 30, which causes a short failure between the adjacent leads 30. According to the present embodiment, as described above, the sufficient contact space is ensured around the second terminal portion 32 of the lead 30. Therefore, such the short failure is prevented from occurrence. Even if the position of the probe end 62 varies slightly, the short failure can be prevented.

In the case of the TCP-type semiconductor device, the base film 10 expands and contracts due to moisture absorption and desiccation. Therefore, the lead pitch LP may become different from the probe pitch. Even in this case, the short failure can be prevented due to the above-described reason. For example, let us consider a case where the probe pitch is beforehand designed in consideration of a state where the base film 10 expands due to the moisture absorption and hence the lead pitch LP is enlarged. During a packaging process, the base film 10 becomes dry due to high-heat treatment and the lead pitch LP tends to become smaller. That is to say, the lead pitch LP may become smaller than the probe pitch. Even in this case, the short failure can be prevented, because the sufficient contact space is ensured around the second terminal portion 32 of the lead 30 as shown in FIG. 4.

Figure 5:
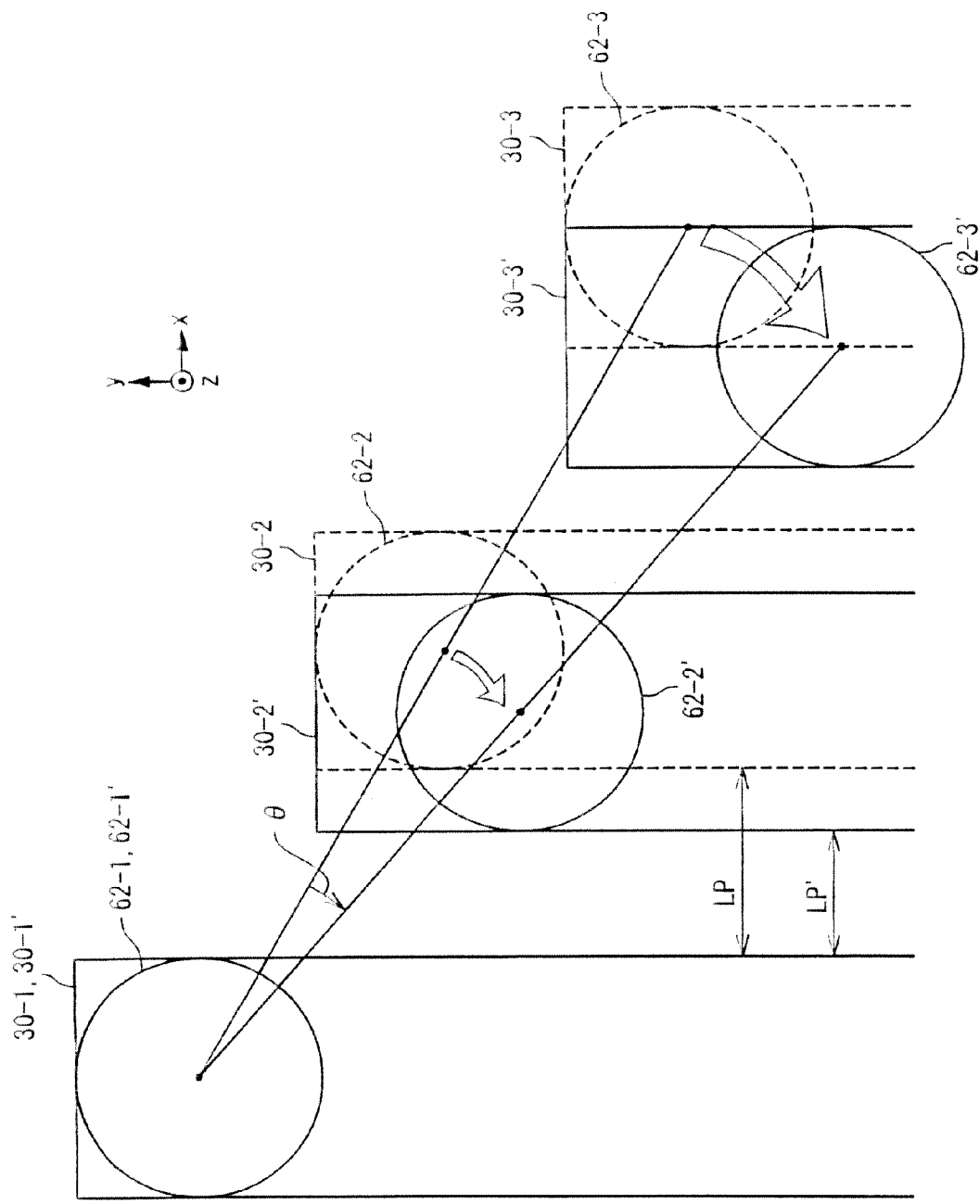
FIG. 5 is a schematic diagram showing a method of testing the semiconductor device according to the present embodiment.

Note that, in the case where the lead pitch LP deviates from the probe pitch due to expansion and contraction of the base film 10, the following processing may be performed. FIG. 5 shows a relative positional relationship between leads 30-1 to 30-3. Probe ends 62-1 to 62-3 come in contact with the leads 30-1 to 30-3, respectively. Here, let us consider a case where the base film 10 shrinks and the relative positional relationship between the leads 30-1 to 30-3 is changed as indicated by 30-1' to 30-3' in FIG. 5. In this case, the lead pitch LP is changed to a smaller LP' (<LP). In order to achieve an excellent contact between the lead 30 and the probe end 62, an apparent probe pitch just needs to be made smaller in accordance with the reduction of the lead pitch LP. To this end, the probes 60 (probe ends 62) are rotated in the θ direction around the z-direction (the direction perpendicular to a surface of the base film 10 and orthogonal to the x- and y-directions) as an axis of rotation. As a result, a relative positional relationship between the probe ends 62-1 to 62-3 is changed as indicated by 62-1' to 62-3' in FIG. 5. That is to say, the apparent probe pitch is reduced. After that, the probe ends 62-1' to 62-3' are brought into contact with the leads 30-1' to 30-3', respectively. Moreover, the positions of the probe ends 62 may be adjusted in the x-direction and in the y-direction such that a contact area becomes the maximum.

According to the present embodiment, as described above, it is possible to prevent the short failure between the leads 30 at the time of the test. After the each probe 60 comes in one-on-one contact with the corresponding lead 30, a test signal is supplied from a tester to the semiconductor chip 20 or an output signal is retrieved from the semiconductor chip 20 through the probe card 50 and the leads 30. Consequently, tests of input/output, electrical characteristics and the like of the semiconductor chip 20 can be achieved successfully.

4. Effects

According to the present embodiment, at the time of testing the semiconductor device 1, a special contact pad is not used for contact with the probe card 50. Instead, the second terminal portion 32 within the external terminal region RE is used for contact with the probe card 50. Therefore, the contact pads 140 dedicated to test as shown in FIG. 1 are not provided, and the pad placement region RP is excluded from on the base film 10. As a result, a region on the base film 10 required for one semiconductor chip 20 can be greatly reduced as compared with the case of FIG. 1. It is therefore possible to reduce material cost and also to improve efficiency of placing the semiconductor chips 20 on the base film 10. It is thus possible to reduce the costs of manufacturing the semiconductor device 1.

Moreover, according to the present embodiment, the sufficient contact space is ensured around the second terminal portion 32 of the lead 30 in the external terminal region RE. Therefore, the short failure between the adjacent leads 30 at the time of the test can be prevented even under a condition of a narrow lead pitch LP. In other words, the short failure can be prevented, although not the contact pad but the lead 30 is used for the contact with the probe card 50. The short failure can be prevented even if misalignment of the probe or expansion and contraction of the base film 10 occurs. As a result, the test of the semiconductor device 1 can be performed successfully. Moreover, deterioration of test efficiency due to the short failure is prevented, which can reduce the test cost.

Furthermore, according to the present embodiment, short failure caused by metal burr can be suppressed. As a comparative example, let us consider the case shown in FIG. 1. In the comparative example, the semiconductor chip 120 is connected to the test contact pads 140 through the leads 130. Therefore, on separating the semiconductor device one by one, it is necessary to cut the leads 130 along the cut line CL. The metal burr generated at this time can cause the short failure later. According to the present embodiment, on the other hand, the test contact pads 140 are not provided. As shown in FIG. 2, the leads 30 are formed only within the region surrounded by the cut line CL. Therefore, on separating the semiconductor device 1 one by one, cutting of the leads 30 is not performed. As a result, the short failure caused by the metal burr can be suppressed. In addition, a jig used for separating the semiconductor device 1 one by one need not cut the metal lead 30, and thus the jig life is increased.

5. Modification Examples

Figure 6:
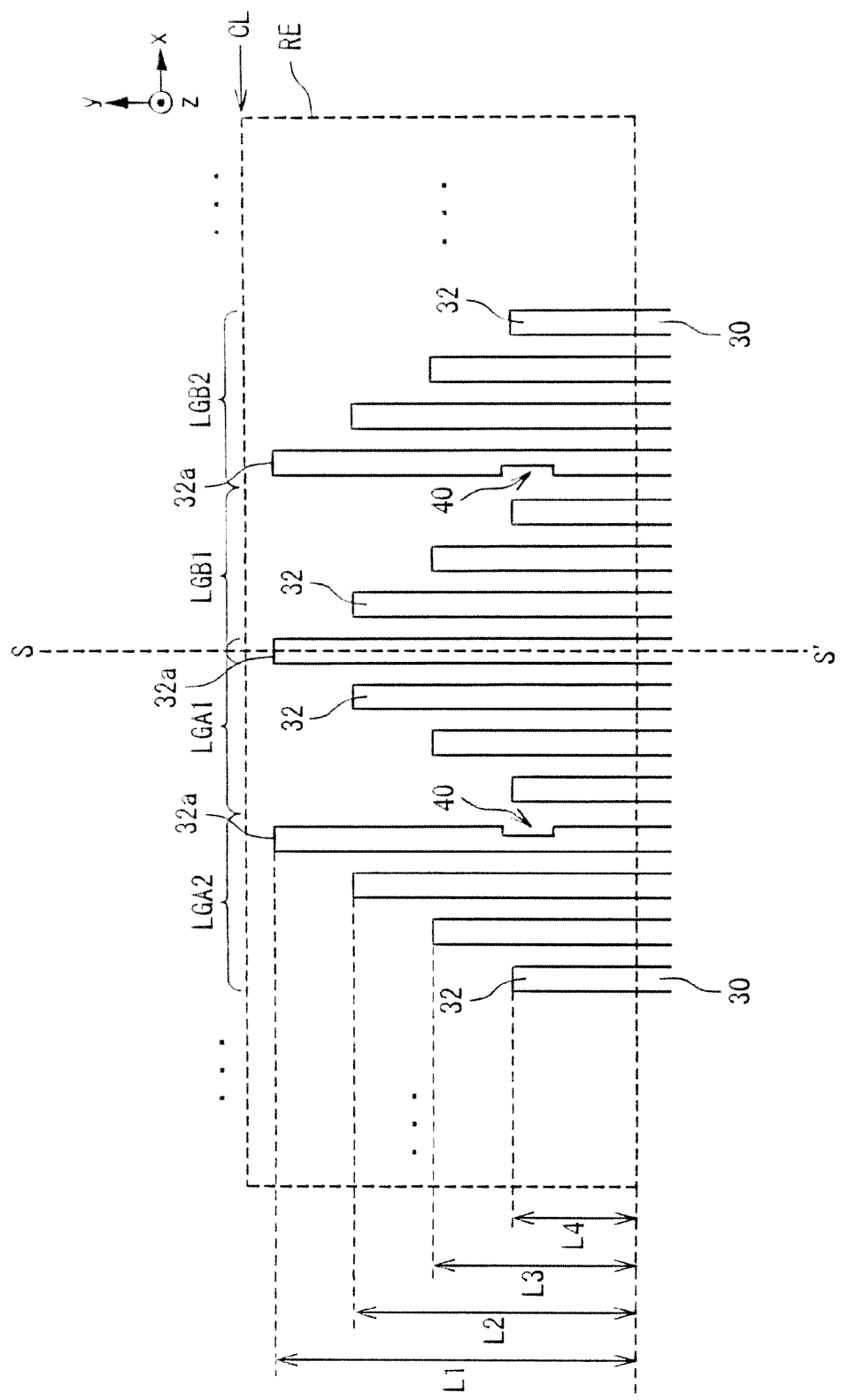
FIG. 6 is a plan view showing a modification example of the lead configuration in the external terminal region of the semiconductor device according to the present embodiment.

FIG. 6 shows a modification example of the configuration of the leads 30 in the external terminal region RE. Each lead group LG has a lead pattern similar to that shown in FIG. 3. That is, the four leads 30 included in each lead group LG are arranged such that the length becomes monotonically smaller from the longest lead to the shortest lead. However, the arrangement direction from the longest lead toward the shortest lead is reversed across a line S-S' along the y-direction. In other words, the plurality of leads 30 are arranged symmetrically across the line S-S' within the external terminal region RE. For example, the line S-S' is substantially centrally-positioned in the external terminal region RE.

More specifically, lead groups LGA1, LGA2 . . . are arranged on the −x side of the line S-S'. As for the lead groups LGA1, LGA2 . . . , the arrangement direction from the longest lead toward the shortest lead is the −x-direction. As a result, the space is ensured on the −x-direction side of the second terminal portion 32 of each lead 30. On the other hand, lead groups LGB1, LGB2 . . . are arranged on the +x side of the line S-S'. As for the lead groups LGB1, LGB2 . . . , the arrangement direction from the longest lead toward the shortest lead is the +x-direction. As a result, the space is ensured on the +x-direction side of the second terminal portion 32 of each lead 30. The same effects as described above can be obtained even by this configuration. If the line S-S' is substantially centrally-positioned in the external terminal region RE, the numbers of the lead groups LGA on the −x side and the lead groups LGE on the +x side are the same.

In the present example, the number of leads 30 in the external terminal region RE may be odd if the leads 30 are arranged completely symmetrically. However, plural leads 30 having the same length can be arranged near the line S-S', since a cumulative position error between the probe end 62 and the second terminal portion 32 is small near the center of the external terminal region RE. Consequently, a case where the number of leads 30 in the external terminal region RE is even can be dealt with.

Figure 7:
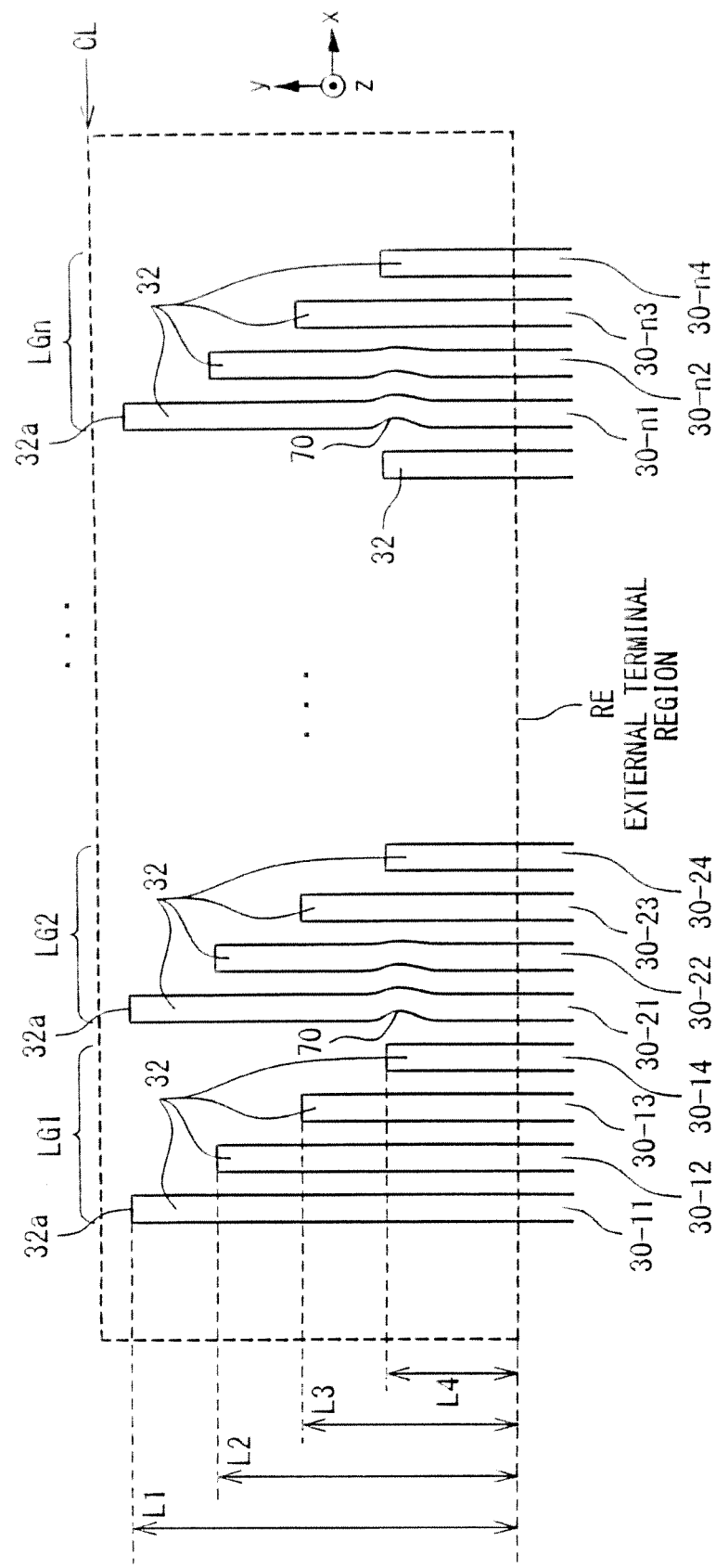
FIG. 7 is a plan view showing another modification example of the lead configuration in the external terminal region of the semiconductor device according to the present embodiment.

FIG. 7 shows another modification example of the configuration of the leads 30 in the external terminal region RE. In the present example, the above-mentioned notch portion 40 is not formed on the lead 30 adjacent to the shortest lead. Instead, the lead 30 adjacent to the shortest lead has a bent portion 70 at a position facing with at least a part of the second terminal portion 32 of the shortest lead. The bent portion 70 is swelling on the opposite side of the second terminal portion 32 of the shortest lead. In other words, the lead 30 adjacent to the shortest lead is so formed as to be further away from the shortest lead around the second terminal portion 32 of the shortest lead. Therefore, a sufficient contact space is ensured around the second terminal portion 32 of the shortest lead. As a result, the same effects as describe above can be obtained. Moreover, the lead 30 is prevented from being partially thin, because the notch portion 40 is not formed.

In the above-described examples, the pitch (spacing) between the leads 30 is uniform and the notch portion 40 is formed. In order to place as many leads 30 as possible within the external terminal region RE, it is generally advantageous to arrange the leads 30 with the minimum pitch (i.e. the minimum spacing). However, with regard to the width of the base film 10, there are some standardized widths (e.g. 35 mm, 48 mm, 70 mm). Therefore, not all the leads 30 may necessarily be arranged with the minimum pitch (minimum spacing), depending on a relationship between the number of necessary leads 30 and the maximum effective width of the external terminal region RE on the base film 10.

Figure 8:
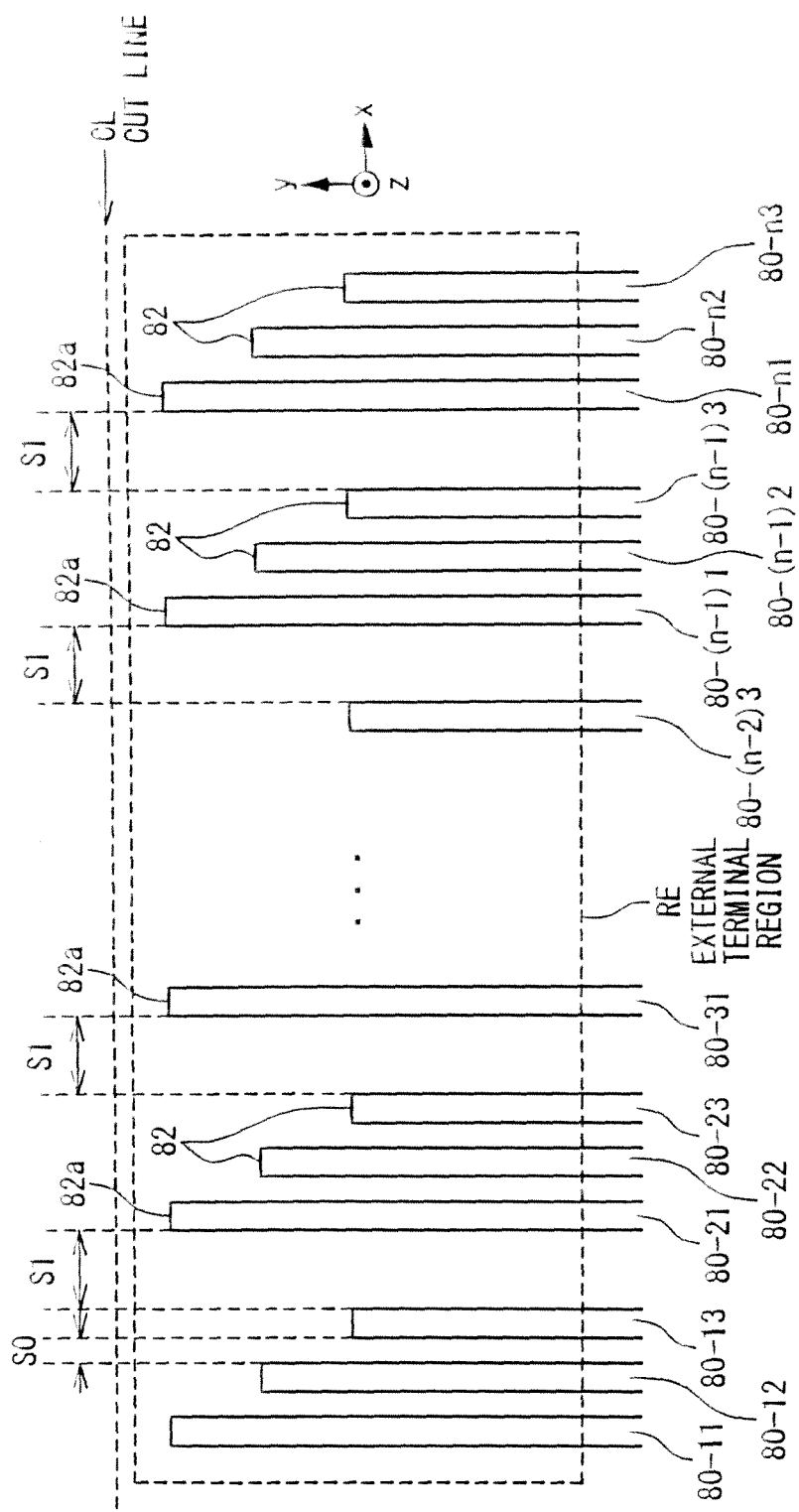
FIG. 8 is a plan view showing still another modification example of the lead configuration in the external terminal region of the semiconductor device according to the present embodiment.

In that case, the notch portion 40 is not necessarily formed. As shown in FIG. 8, a spacing (gap) Si between the shortest lead 80-13 and the adjacent longest lead 80-21 may be designed to be larger by more than the depth of the notch portion 40 than the minimum value S0 of the spacing (gap) between adjacent leads 80. Even in this case, the same effects as describe above can be obtained. Moreover, the lead 80 is prevented from being partially thin, because the notch portion 40 is not formed.

By the way, in the example shown in FIG. 8, each lead group LG has three leads 80-i1 to 80-i3, namely, the length is varied every three leads 80. This is preferable in a case where the TCP-type semiconductor device is installed in a typical display device. In this case, output signals respectively associated with the three primary colors (R, G, B) are output from the TCP-type semiconductor device to electrodes of a display panel. Therefore, a cycle of pixel column of the display device accords with a cycle of the lead length. Thus, the cyclic nature can be maintained irrespective of the number of columns of pixels of the display device, which facilitates the lead designing. Needless to say, the cycle is not limited to three.

Figure 9:
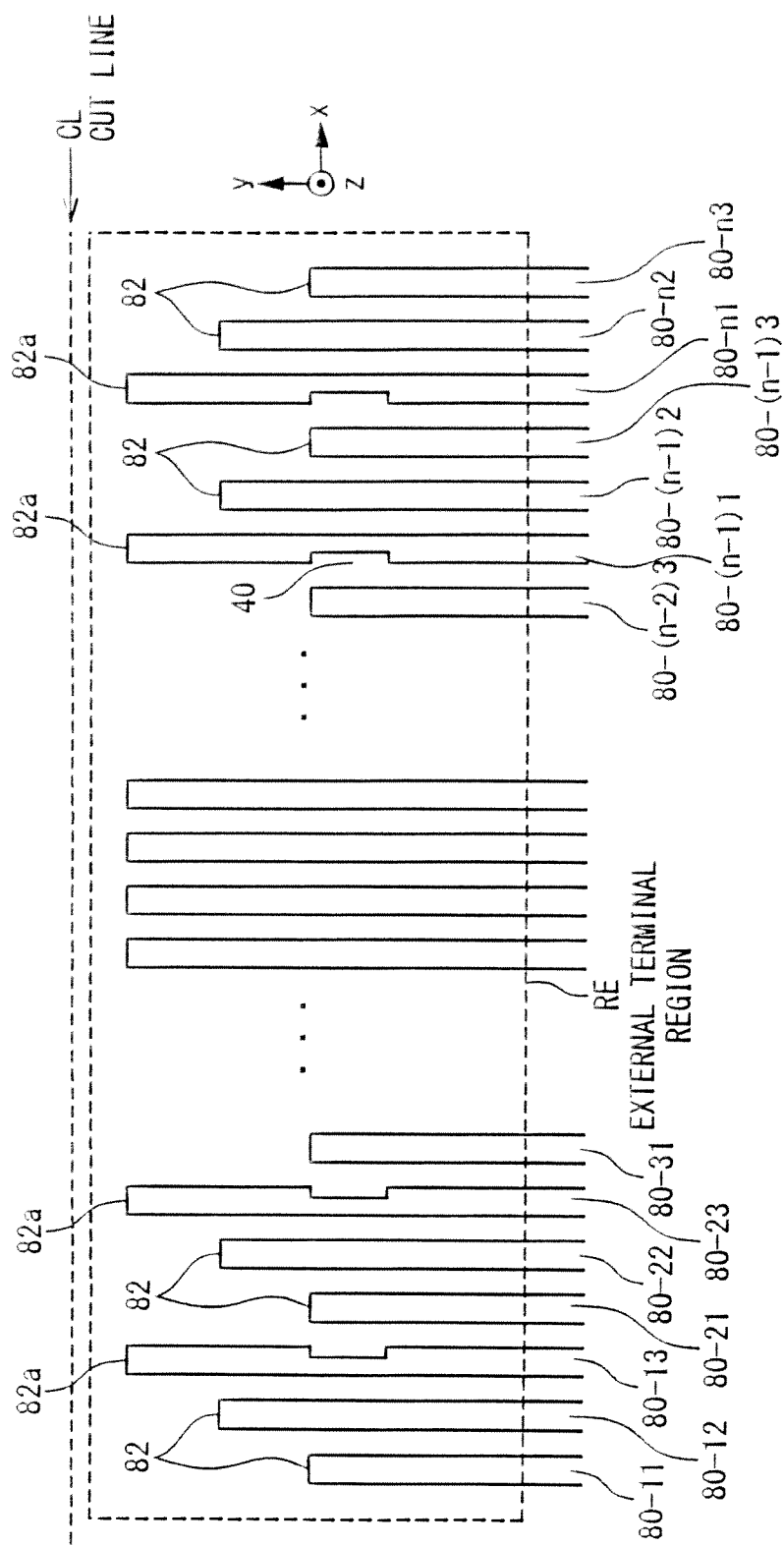
FIG. 9 is a plan view showing still another modification example of the lead configuration in the external terminal region of the semiconductor device according to the present embodiment.

FIG. 9 shows a further modification example of the case shown in FIG. 6. Even if the probe card is designed in consideration of a standard moisture absorption state of the TCP base film, the amount of moisture absorption of the base film may be decreased during a process of assembling the TCP. In this case, the base film shrinks uniformly in the width direction. Therefore, if the probe and the external terminal are aligned near the center of the base film, the outer probes outward-misalign with the corresponding external terminals on both outer sides. The amount of the misalignment is small near the center of the base film but becomes cumulatively larger towards the both sides. In the case of FIG. 9, usual external terminals having the same length are placed near the center of the base film where the misalignment amount is small, and the present invention is applied to regions nearer to the both sides where the misalignment amount becomes larger.

Consequently, the number of external terminals to be made shorter can be minimized. In the device equipped with this TCP-type semiconductor device, the connectivity of the terminal can be thus improved.

Figure 10:
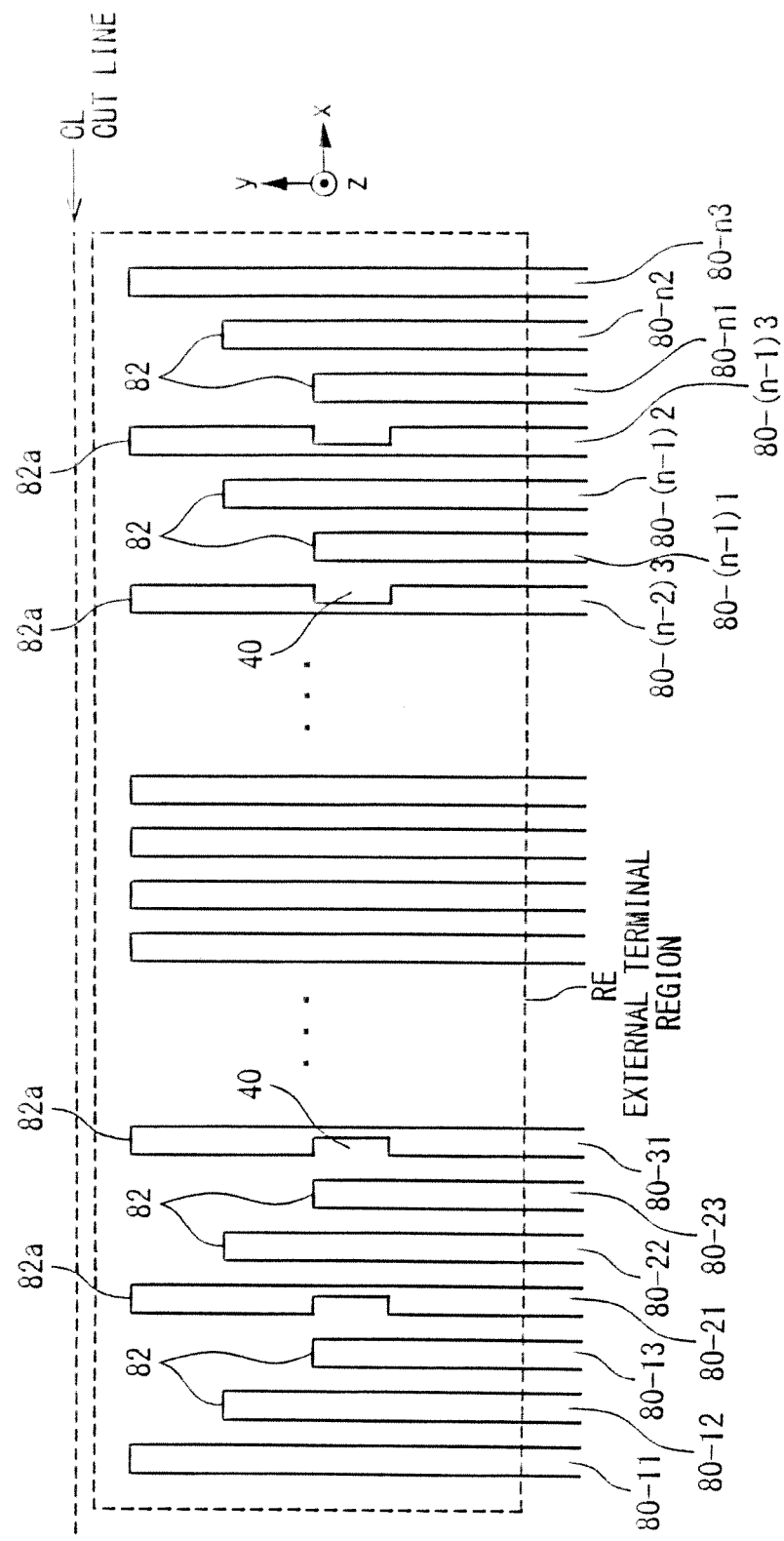
FIG. 10 is a plan view showing still another modification example of the lead configuration in the external terminal region of the semiconductor device according to the present embodiment.

FIG. 10 shows another modification example of the case shown in FIG. 6. If the probe card is designed in consideration of a low moisture absorption state of the TCP base film, the probes may inward-misalign with the corresponding external terminals on both outer sides. To deal with this case, the arrangement direction from the longest lead toward the shortest lead is reversed as compared with the case of FIG. 9.

Figure 11:
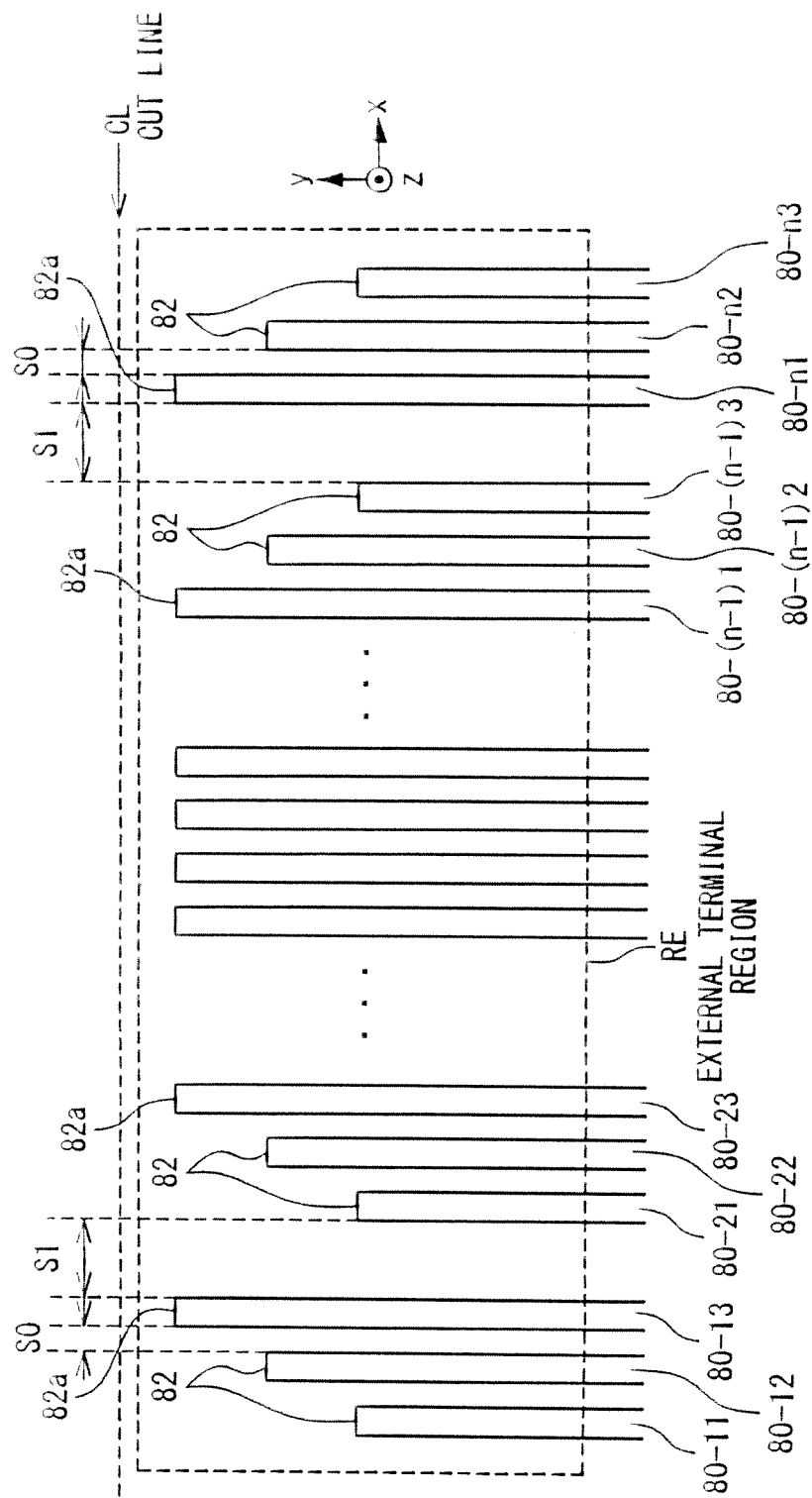
FIG. 11 is a plan view showing still another modification example of the lead configuration in the external terminal region of the semiconductor device according to the present embodiment.

FIG. 11 shows a case where the method shown in FIG. 8 is applied to the TCP-type semiconductor device shown in FIG. 9. In this case, the respective effects obtained in the cases of FIG. 8 and FIG. 9 can be obtained simultaneously.

Figure 12:
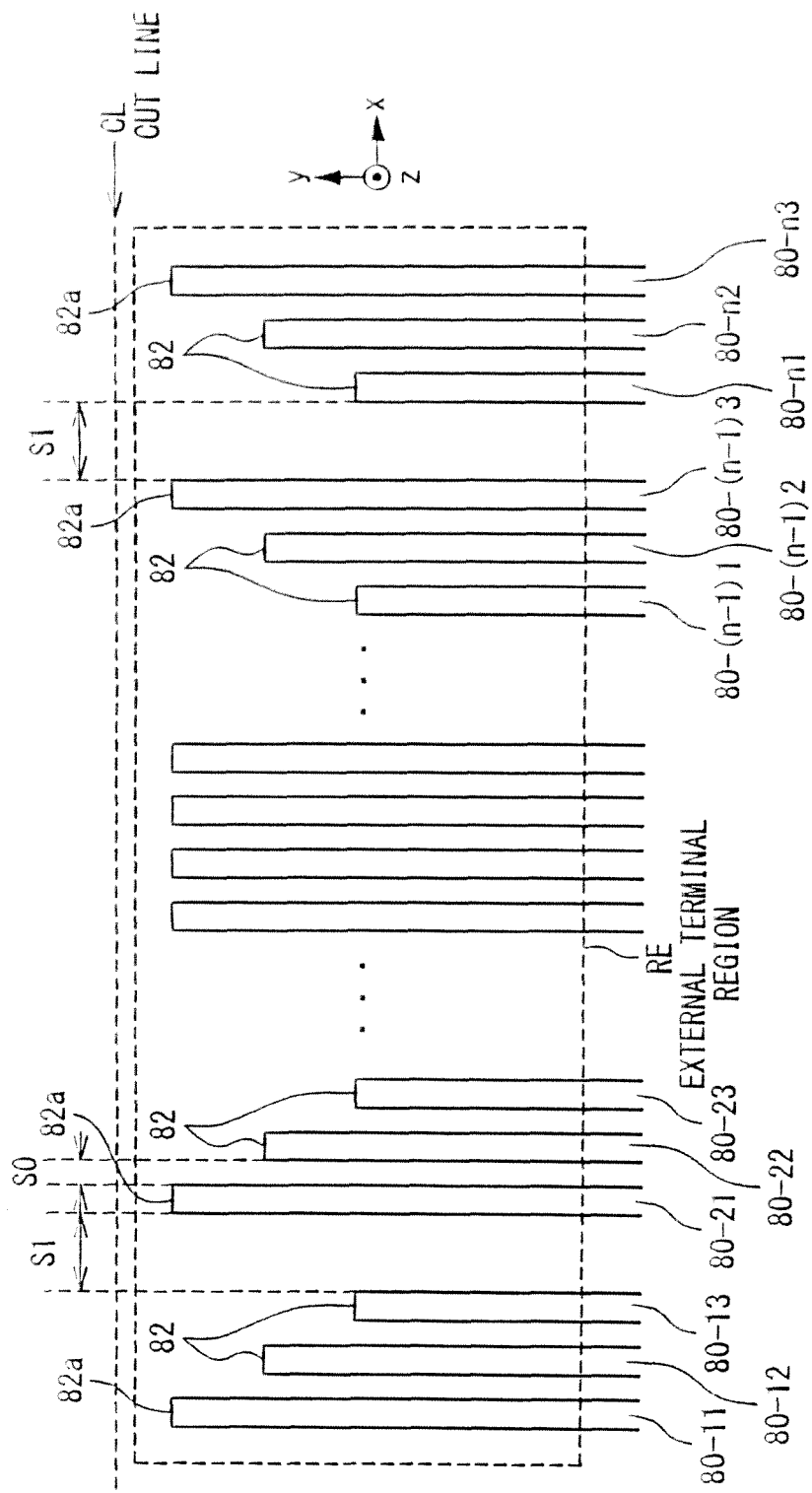
FIG. 12 is a plan view showing still another modification example of the lead configuration in the external terminal region of the semiconductor device according to the present embodiment.

FIG. 12 shows a case where the method shown in FIG. 8 is applied to the TCP-type semiconductor device shown in FIG. 10. In this case, the respective effects obtained in the cases of FIG. 8 and FIG. 10 can be obtained simultaneously.

It is apparent that the present invention is not limited to the above embodiments and may be modified and changed without departing from the scope and spirit of the invention.

What is claimed is:

1. A semiconductor device, comprising:
a base film;
a semiconductor chip mounted on the base film; and
a plurality of leads formed on the base film, each of the leads including one end coupled to the semiconductor chip and another end being opposite to the one end,
wherein the another end of a first one of the leads and the another end of a second one of the leads are located at different positions respectively between the semiconductor chip and a cut line along which the base film is cut.

2. The semiconductor device according to claim 1, wherein the another end of a third one of the leads is located at a different position from the another one ends of the first and second ones of the leads.

3. The semiconductor device according to claim 2, wherein the first one of the leads is adjacent to the second one of the leads, and the second one of the leads is adjacent to the third one of the leads,
wherein a distance between the cut line and the another end of the first one of the leads is less than a distance between the cut line and the another end of the second one of the leads, and
wherein the distance between the cut line and the another end of the first one of the leads is less than a distance between the cut line and the another end of the third one of the leads.

4. The semiconductor device according to claim 3, wherein a fourth one of the leads is adjacent to the third one of the leads and a distance between the cut line and the another end of the fourth one of the leads is less than the distance between the cut line and the another end of the second one of the leads.

5. The semiconductor device according to claim 1, wherein the second one of the leads includes a notch portion facing with the another end of the first one of the leads.

6. The semiconductor device according to claim 1, wherein the second one of the leads includes a bent portion facing with the another end of the first one of the leads.

7. The semiconductor device according to claim 1, wherein a first group of the leads includes specific leads having distances between the cut line and the another ends of the specific leads which are substantially same as distances between the cut line and the another ends of another specific leads included in a second group of the leads.

8. The semiconductor device according to claim 1, further comprising a solder resist covering respective one ends of the leads and not covering respective another ends of the leads.

9. The semiconductor device according to claim 1, wherein the another end of the first one of the leads and the another end of the second one of the leads are devoid of being connected to a contact pad.

10. The semiconductor device according to claim 1, wherein, from the one end of said each of the leads to the another end of said each of the leads, the leads extend parallel to each other.

11. The semiconductor device according to claim 1, wherein, from the one end of said each of the leads to the another end of said each of the leads, all of the leads extend parallel to each other.

12. The semiconductor device according to claim 1, wherein, from the one end of said each of the leads to the another end of said each of the leads, said each of the leads extends parallel to the first one of the leads.

13. The semiconductor device according to claim 1, wherein the another end of said each of the leads is located between the semiconductor chip and the cut line.

14. The semiconductor device according to claim 1, wherein the plurality of leads extend symmetrically on opposing sides of the semiconductor chip.

15. The semiconductor device according to claim 1, wherein the second one of the leads includes a notch portion that faces with the first one of the leads.

16. A semiconductor device, comprising:
a base film;
a semiconductor chip mounted on the base film; and
a first lead and a second lead formed on the base film, each of the first and second leads including one end coupled to the semiconductor chip and another end being opposite to the one end,
wherein the another end of the first lead and the another end of the second lead are located at different positions respectively between the semiconductor chip and a cut line along which the base film is cut.

17. The semiconductor device according to claim 16, wherein the second lead includes a notch portion that faces the first lead.

18. The semiconductor device according to claim 16, wherein the second lead includes a notch portion that faces the another end of the first lead.

19. The semiconductor device according to claim 16, wherein the another end of the first lead and the another end of the second lead are devoid of being connected to a contact pad.

\* \* \* \* \*